United States Patent
Song et al.

(10) Patent No.: US 7,254,771 B1
(45) Date of Patent: Aug. 7, 2007

(54) ERROR-ERASURE DECODING OF INTERLEAVED REED-SOLOMON CODE

(75) Inventors: Leilei Song, Eatontown, NJ (US); Meng-Lin Yu, Morganville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/577,177

(22) Filed: May 23, 2000

(51) Int. Cl.
*H03M 13/00* (2006.01)

(52) U.S. Cl. ........................................ 714/781; 714/794

(58) Field of Classification Search ................. 714/785, 714/762, 756, 774, 784, 755, 701, 781, 794
See application file for complete search history.

(56) References Cited

U.S. PATENT DOCUMENTS

| | | | | |
|---|---|---|---|---|
| 4,665,523 A | * | 5/1987 | Citron et al. ................ | 714/785 |
| 4,835,772 A | * | 5/1989 | Peile et al. .................. | 714/762 |
| 5,809,042 A | | 9/1998 | Nakamura et al. ......... | 371/37.5 |
| 6,047,395 A | * | 4/2000 | Zook .......................... | 714/756 |
| 6,240,538 B1 | * | 5/2001 | Dent et al. .................. | 714/762 |
| 6,272,659 B1 | * | 8/2001 | Zook .......................... | 714/774 |
| 6,304,994 B1 | * | 10/2001 | Oh et al. ..................... | 714/784 |
| 6,308,295 B1 | * | 10/2001 | Sridharan et al. ........... | 714/755 |

OTHER PUBLICATIONS

J. Chen and P. Owsley, "A burst–error–correcting algorithm for Reed–Solomon Codes," IEEE Trans. on Information Theory, vol. 38, No.6, Nov. 1992, pp. 1807–1812.
V.Y. Krachkovsky and Y. X. Lee, "Decoding for Iterative Reed–Solomon Coding Schemes," IEEE Trans. on Magnetics, vol. 33, No. 5, Sep. 1997, pp. 2740–2742.

* cited by examiner

*Primary Examiner*—David Ton

(57) ABSTRACT

A method of decoding interleaved Reed-Solomon codes to achieve an improved performance for burst errors is described. The method takes advantage of both interleaving and erasure decoding to increase the error correcting capability of a system without necessarily depending on channel reliability information. The observed correlation of burst errors in interleaved systems is advantageously used to achieve an improved error-correcting system, wherein a first code word is decoded, and the error locations in the first codeword are used to determine erasures for the remaining code words in the same interleaving block, and finally, decoding the remaining code words in parallel.

10 Claims, 2 Drawing Sheets

ERROR-ERASURE DECODING OF INTERLEAVED REED-SOLOMON CODE

TECHNICAL FIELD

The present invention is related in general to error-control coding methods, and, in particular, to a method of reducing the decoding complexity and/or improving the burst-error-correcting capabilities of codes such as interleaved Reed-Solomon block codes.

BACKGROUND

Referring to the drawings, FIG. 1 (PRIOR ART) depicts a typical system 100 for encoding and decoding data. Original information (typically, digital data) from a source is encoded using an encoder 102 and transmitted over a communication channel (or stored on a storage device) 104. It is assumed that like all practical systems, the transmission channel is noisy (or the storage medium has errors), and this channel noise causes symbol errors in the words received at the end of the transmission channel. A symbol error is said to occur if any one or more bits in a symbol (for example, a byte) are wrong. The data so transmitted (or stored) is thereafter retrieved and decoded using a decoder 106 to reproduce the original information.

To ensure accurate storage, retrieval and transmission of data, a robust mechanism for checking and correcting errors is needed. Original information may be corrupted when it is transmitted or stored for subsequent retrieval. Sources of corruption in data include a noisy transmission channel, a scratch on a digital storage device such as a compact disk, and the like. The number of symbols any two code words are separated is called the "distance," or, more commonly, the Hamming distance, between the two code words. A common measure of the error-correcting capability of a system is the minimum distance $d_{min}$ between valid code words.

It is well known that adding redundant information to data can help ensure accuracy of stored or transmitted information. Every k-symbol block of code word can be encoded into an n-symbol block (n>k) by adding n-k redundant symbols. The simplest error-correcting code is simply to repeat everything several times and then use a majority vote or other method to recover the original information from the corrupted data. But this "brute force" information recovery method does not achieve the goal of a high-speed, high-density information processing system.

Channel errors can occur at randomly isolated locations or in localized finite-length sequences. The latter are known as burst errors. A sequence of burst errors may affect many symbols in one code word and cause the decoder to fail to retrieve the original information from a corrupted code word. In J. Chen and P. Owsley, "A burst-error-correcting algorithm for Reed-Solomon Codes," IEEE Trans. on Information Theory, vol. 38, no. 6, November 1992, at pp. 1807–12 an algorithm for correcting burst errors was presented, but it is effective only for correcting a single burst in each code word.

A more efficient technique, known as interleaving, can be used to extend the capability of linear block codes. In this technique, several code words are generated simultaneously and stored in a memory matrix row-wise. These code words are then transmitted across a channel column-wise. In this way, a burst of symbol errors is distributed among multiple received words and a fewer errors occur in each received word. FIG. 2 illustrates an 8-bit interleaved system, where each row corresponds to one code word and the code word matrix is transmitted column-wise. In this example, a burst error across 11 symbols (shown shaded in the figure) is spread such that it causes maximally 2 symbol errors in each received word.

Reed-Solomon (RS) codes is helpful in correcting burst errors, where a series of bits in a code word are received in error. The advantage with RS codes is that they provide a high coding gain at a high code rate (k/n). This means that an RS decoder can recover from more errors with less redundant symbols. Stated alternatively, RS codes allow a target Bit Error Ratio (BER) to be achieved with a lower transmitter output power. RS codes were first proposed in a classic 1960 paper entitled "Polynomial Codes over Certain Finite Fields" by Irving S. Reed and Gustave Solomon. RS codes are based on a specialist area of mathematics known as finite fields or Galois fields. They are a subset of BCH codes and are linear block codes with a wide range of applications in digital communications—wireless or mobile communications including cellular telephones, microwave links, satellite communications, digital television, high-speed modems (ADSL, xDSL)—and storage systems including compact disk, DVD, bar codes and others.

Interleaved RS decoders have been found to be useful in satellite and optical communication systems as well as in storage applications. When interleaving is used, it is very likely that received words in one interleaving block have the same error locations. This observation was used in a method presented in V. Y. Krachkovsky and Y. X. Lee, "Decoding for Iterative Reed-Solomon Coding Schemes," IEEE Trans. on Magnetics, vol. 33, no. 5, September 1997, pp. 2740–42 ("Krachkovsky et al."), where all check symbols in each row code are combined to find a "covering error locator polynomial" that covers all possible error locations in every code word.

In systems where burst errors are common there is a demand for large coding gain and a very small tolerance for increase in hardware complexity. Accordingly, there is a need for an improvement in the art.

SUMMARY

An embodiment disclosed herein is directed toward a method of decoding interleaved error correcting codes to achieve an improved performance for burst errors. The scheme takes advantage of both interleaving and erasure decoding to increase the error correcting capability of a system without necessarily depending on channel reliability information.

In one aspect, a disclosed embodiment advantageously uses an observed correlation of burst errors in interleaved systems to achieve an improved error-correcting system. This is achieved in an embodiment by first decoding a first code word from which error locations are determined. These locations are flagged as erasure locations in the remaining code words of the same interleaving block. Thereafter, the remaining code words are decoded in parallel.

In a further aspect, the method uses an incremental decoding scheme whereby erasures in succeeding rows can be flagged based on the combined information of erasure locations from all previous rows together with the soft reliability information of the current row, thereby improving the decoder performance further. This latter procedure is found to increase the latency of the decoder. In a yet another embodiment, a code word in each interleaving block can be made stronger to achieve an improved decoder performance.

Among other things, an embodiment of the method disclosed herein achieves a high performance with reduced hardware complexity, or a better performance with a given hardware complexity. Component codes can be illustratively understood as rows in an interleaved code block. In one aspect, an embodiment of the disclosed method achieves improved error correcting capability using a set of strong— those that require more redundant information—component codes. In a further aspect, it is possible to achieve a reduction in overall complexity of the hardware by using a combination of weak and strong component codes or by sharing the hardware resources.

BRIEF DESCRIPTION OF THE DRAWINGS

These and other features, objects and advantages of the present invention, can be readily understood from the following detailed description of the presently preferred embodiments and the appended claims with a reference to the accompanying drawings, where like numbers designate like parts, and wherein:

DETAILED DESCRIPTION OF THE PRESENTLY PREFERRED EMBODIMENTS

Both interleaving and erasure decoding can be used to extend the error-correcting complexity of a coded digital communication system. The problem with erasure decoding lies in the difficulty and complexity of accurately determining the erasure locations before decoding. It has been discovered that error locations in each received word in an interleaved coding system correlate to one another.

An embodiment of the disclosed method includes a decoding technique that takes advantage of both interleaving and erasure decoding to increase the error correcting capability in a system without necessarily depending on the channel reliability information.

In an embodiment, the invented method uses the discovered correlation between error locations in burst errors in an interleaved coding system to determine the error locations. First, one of the received words r(x) is decoded using standard methods. Then the detected error locations in other received words in the same interleaving block are flagged as erasures. Later, these other received words are decoded, preferably in parallel, using error-and-erasure decoding.

This invention can advantageously be exploited in many variations in designing interleaved error-control codes for burst error dominated systems. Decoding the first received word ensures the overall performance because this facilitates to determine the erasure locations for other received words. Performance of this system can be improved by assigning a stronger Reed-Solomon code to the first code row, using a more elaborate decoding scheme—such as one based on soft channel information—for one of the rows of a sub-code, or using other approaches.

After receiving transmitted information (or retrieval of stored information), and prior to decoding, both the position of an error symbol and value are unknown. In such a scenario, a linear block code with minimum distance $d_{min}$ can correct up to $[(d_{min}-1)/2]$ symbol errors. In some cases, by taking into account the characteristics of the transmission channel or soft information, it is possible to determine the position of an error symbol prior to decoding. A symbol error with known error position but unknown error value is called an "erasure." A demodulator in a digital communication system can supply the erasure information by flagging received symbol likely to contain errors. Given an n-symbol code word containing k data symbols, an (n, k) linear block code can correct t errors and v erasures provided t and v satisfy the relation, $2t+v<=d_{min}-1<=n-k$.

Figure 1:
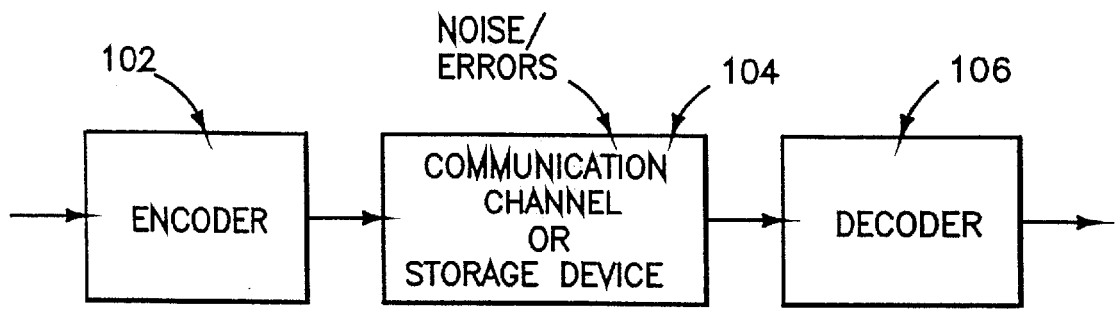
FIG. 1 (PRIOR ART) depicts an architecture of a data communication system including an encoder and a decoder.
Figure 2:
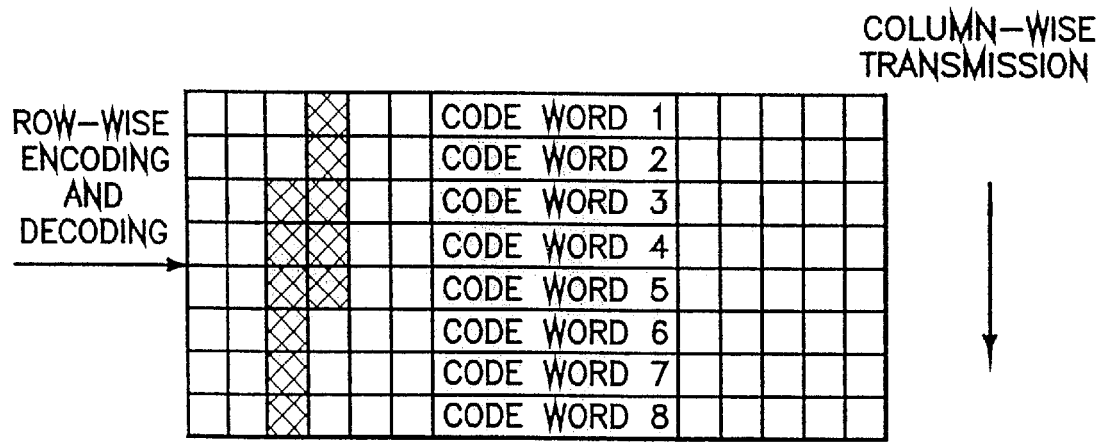
FIG. 2 shows burst error patterns in an interleaved error-control coding system.
Figure 3:
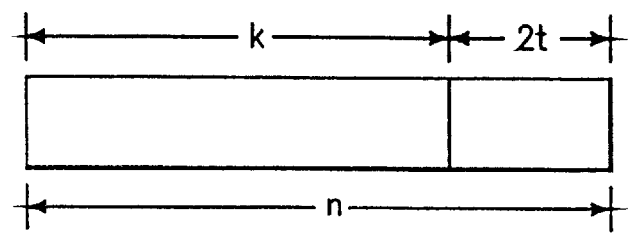
FIG. 3 shows a systemic RS code word in which parity information is appended to data.

Referring to FIG. 3, assume that an RS encoder takes k data symbols of s bits each. The encoder adds parity symbols to make an n-symbol code word. There are n-k parity symbols of m bits each. During decoding, an RS decoder can correct up to t symbols with errors in a code word, where $t=(n-k)/2$. During decoding, the decoder will be able to (1) recover the original information if $2t+v<=d_{min}-1<=n-k$, (2) detect that it cannot recover the original information, or (3) decode erroneously and recover an incorrect code word.

An RS code is specified as RS(n,k) with m-bit symbols. RS encoding and decoding can be performed in either software or in special-purpose hardware. The general structure of an RS encoder is given by $$c(x)=g(x) \cdot i(x) \tag{1}$$

where c(x) is the codeword, i(x) is the information block, and g(x) is a generator polynomial of the form:

$$g(x)=(x-a^i)(x-a^{i+1}) \ldots (x-a^{i+2t-1}) \tag{2}$$

The 2t parity symbols in a systemic (where data is left unchanged and parity symbols are appended to the data to make up the code word) RS codeword are given by the equation:

$$p(x)=i(x) \cdot x^{n-k} \bmod g(x) \tag{3}$$

The received code word is the original (transmitted) code word c(x) plus errors e(x):

$$r(x)=c(x)+e(x) \tag{4}$$

A "syndrome" is a string of digits representing a series of tests such as parity checks on a series of bits in symbols or series of symbols. For RS codes, a syndrome is a symbol of a finite field. Syndromes can be calculated by substituting the 2t roots of the generator polynomial into r(x), which results in 2t syndromes of m bits each. These 2t syndromes together indicate whether the block (of code words) has errors, and in case of errors, the 2t syndromes can be used to determine the error locations and error values and therefore help in the recovery of the original information.

An architecture for decoding RS codes includes a syndrome calculator, an error locator, an error magnitude calculator, and an error corrector. RS decoder is constrained by two characteristics, latency and processing delay. Latency of a decoder is the number of symbol periods from a symbol being sampled at the data input port (of the decoder) to a corrected version of that symbol appearing at the data output port (of the decoder). Thus, latency is dependent on the number of correctable errors and the number of symbols in a code block. Processing delay is the number of symbol periods from the start of a code block to the start of the next code block. Latency and processing delay are not necessarily related to each other—a subsequent code block may start before the latency period is over.

As an illustration of the principles of invention, consider an 8-level interleaved Reed-Solomon code. A first row in a sub-code is encoded with a stronger RS code. The first row is decoded using an error-only scheme.

For the extreme case of correcting one long burst error containing 64 symbols, eight 8-symbol error correction RS codes are required. Using the present invention, these burst errors can be eliminated by interleaving one 8-symbol error correcting RS code and seven 5-symbol error correcting RS codes. The 8-symbol error correcting RS code captures the eight error locations in the first code word. These error locations are then flagged as erasures for the other seven RS decoders. A 5-symbol error-correcting RS code can correct t errors and v erasures provided 2t+v<=10. Therefore, it can correct 8 erasures and 1 extra error that may not be covered by the first decoder as shown in FIG. 3.

Figure 4:
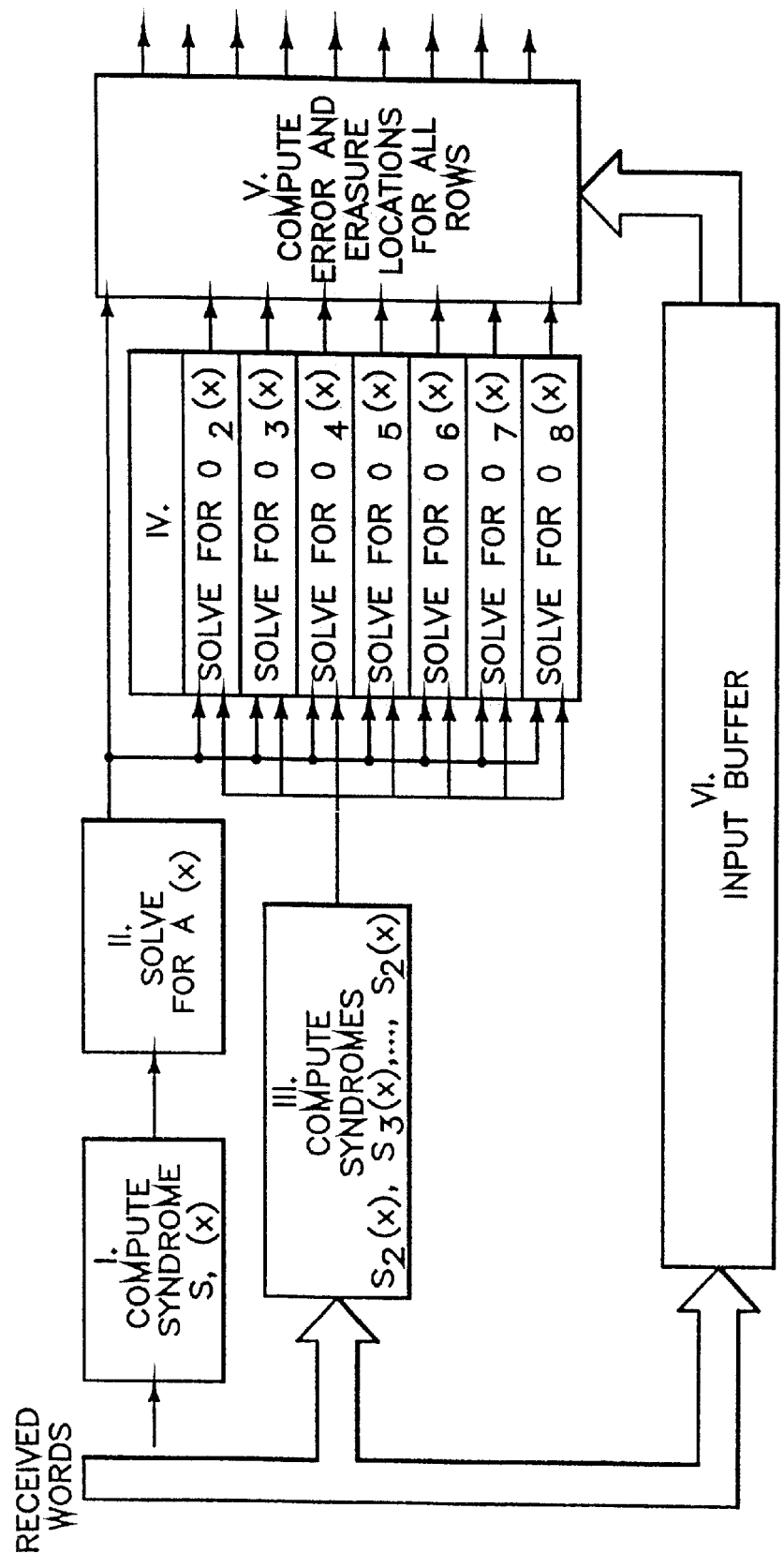
FIG. 4 is a block diagram of an 8-level interleaved RS decoder implemented according to the present invention.

Referring to FIG. 4, decoding the interleaved block code words includes the acts of:

(1) Computing syndromes associated with each received word, $S_i(x)$, for $1<=i<=8$;

(2) Computing an error-locator polynomial $\Lambda(x)$ for the first received word;

(3) Using $\Lambda(x)$ as the erasure polynomial, computing error-locator polynomials $\delta_i(x)$ for the remaining received words, i.e., for $2<=i<=8$;

(4) Computing error magnitude; and (5) Performing error correction for all received words.

In an alternative embodiment, the acts (3), (4) and (5) are performed in parallel. A single Reed-Solomon decoder requires blocks I, II, part of block V and block VI, where block II is the most complicated part. Block II computes the error locator polynomial for the first code row, which is then used as the erasure polynomial for the rest of the 7 code rows. Hence computation in block II is shared among all 8 sub-codes, which leads to savings in hardware. Furthermore, computation of erasure locations in the block V can also be shared among 8 sub-code rows.

The preceding example has a latency slightly greater than that of a typical RS decoding iteration. In systems with no strict latency constraints, an incremental decoding procedure can be used to further improve the decoding performance. In this case, decoding starts with the first code word row and proceeds sequentially one row after another. The detected error locations in the $i^{th}$ code word row are flagged as erasure locations for the $i+1^{th}$ row. Moreover, in this incremental decoding scheme, erasures in succeeding rows can be flagged based on the combined information from error locations from all previous rows together with the soft reliability information from the current row. This further improves the decoder performance.

The foregoing describes a method of decoding interleaved RS codes to achieve an improved performance/complexity tradeoff for burst errors. The scheme takes advantage of both interleaving and erasure decoding to increase the error correcting capability of a system without necessarily depending on channel reliability information. It is understood that for each application, suitable parameters are selected with accurate channel models and simulations. Persons skilled in the art may make modifications or rearrangements of the invented system without significantly departing from the principles of the present invention or without undue experimentation. All such modifications, departures, or rearrangements should be construed to be within the spirit and scope of the following claims.

What is claimed is:

1. A method of error correction for an interleaved block of received code words, the method comprising the steps of:

computing syndromes associated with each received code word;

computing an error-locator polynomial for a first received code word;

computing error-locator polynomials for the remaining received code words in the same interleaved block using the error-locator polynomial for the first received code word as erasure polynomial for each of the remaining received code words in the same interleaved block;

computing error magnitude for each received code word; and performing error correction for each received code word.

2. The method of error correction as in claim 1, wherein the step of computing error-locator polynomials is performed in parallel for the remaining received code words in the same interleaved block.

3. The method of error correction as in claim 1, wherein the step of computing error magnitude is executed in parallel for all received code words in the same interleaved block.

4. The method of error correction as in claim 1, wherein the step of performing error correction is executed in parallel for all received code words in the same interleaved block.

5. The method of error correction as in claim 1, further comprising the step of:

computing an error-locator polynomial for each received code word after the first code word based on a combined information of error location polynomials for all previous received code words in the same interleaved block.

6. The method of error correction as in claim 1, further comprising the step of:

computing an error-locator polynomial for each received code word after the first code word using soft reliability information for the received code word in the same interleaved block.

7. The method of error correction as in claim 1, further comprising the step of:

inputting channel reliability information.

8. The method of error correction as in claim 1, further comprising the step of:

using a strong first received code word in each interleaving block.

9. A Reed-Solomon decoder according to the method of claim 1 for use in a communications application.

10. A Reed-Solomon decoder according to the method of claim 1 for use in a storage application.

* * * * *